United States Patent
Chen et al.

(10) Patent No.: US 9,161,465 B2
(45) Date of Patent: Oct. 13, 2015

(54) QUICK-RELEASE FIXING STRUCTURE FOR ELECTRONIC EQUIPMENTS

(75) Inventors: Chia-Jung Chen, New Taipei (TW); Yu-Wei Lin, New Taipei (TW)

(73) Assignee: GRAND-TEK TECHNOLOGY CO., LTD., New Taipei (TW)

( * ) Notice: Subject to any disclaimer, the term of this patent is extended or adjusted under 35 U.S.C. 154(b) by 731 days.

(21) Appl. No.: 13/529,849

(22) Filed: Jun. 21, 2012

(65) Prior Publication Data

US 2013/0071176 A1    Mar. 21, 2013

(30) Foreign Application Priority Data

Sep. 19, 2011   (TW) .............................. 100217488 U

(51) Int. Cl.
*H05K 5/02* (2006.01)
*F16B 5/07* (2006.01)
*F16B 21/09* (2006.01)

(52) U.S. Cl.
CPC ................ *H05K 5/0204* (2013.01); *F16B 5/07* (2013.01); *F16B 21/09* (2013.01); *Y10T 403/32975* (2015.01)

(58) Field of Classification Search
CPC ...... A47B 57/40; A47B 57/402; A47B 57/50; F16M 11/041; G03B 21/14; G03B 21/145
USPC .................. 403/392, 346, 386; 248/230.8
See application file for complete search history.

(56) References Cited

U.S. PATENT DOCUMENTS

| | | | | |
|---|---|---|---|---|
| 3,219,157 | A * | 11/1965 | Gordon | 403/108 |
| 3,303,937 | A * | 2/1967 | McConnell | 211/192 |
| 3,392,848 | A * | 7/1968 | McConnell et al. | 211/192 |
| 4,603,829 | A * | 8/1986 | Koike et al. | 248/553 |
| 5,350,074 | A * | 9/1994 | Rosenband | 211/192 |
| 6,241,109 | B1 * | 6/2001 | Kautz et al. | 211/192 |
| 6,309,132 | B1 * | 10/2001 | Jakob et al. | 403/200 |
| 6,554,527 | B1 * | 4/2003 | O'Donnell et al. | 403/353 |
| 6,669,162 | B1 * | 12/2003 | Sears et al. | 248/346.04 |
| 6,766,992 | B1 * | 7/2004 | Parker | 248/300 |
| 6,821,091 | B2 * | 11/2004 | Lee | 416/210 R |
| 7,281,899 | B1 * | 10/2007 | Bucher et al. | 416/210 R |
| 8,197,216 | B2 * | 6/2012 | Wang | 416/210 R |
| 2004/0211872 | A1 * | 10/2004 | Dittmer et al. | 248/323 |
| 2005/0056744 | A1 * | 3/2005 | Ware et al. | 248/219.4 |
| 2006/0198092 | A1 * | 9/2006 | Searby | 361/683 |
| 2012/0242211 | A1 * | 9/2012 | Chang | 312/351.1 |

* cited by examiner

*Primary Examiner* — Daniel Wiley
(74) *Attorney, Agent, or Firm* — Chun-Ming Shih; HDLS IPR Services

(57) ABSTRACT

In a quick-release fixing structure for an electronic equipment, the electronic equipment includes a plurality of holes and a snap slot, and the quick-release fixing structure includes a substrate, a turning element and a plurality of fixing elements. The substrate includes a plurality of grooves and a port, and each groove includes a first groove hole and a second groove hole interconnected to the first groove hole, and the second groove hole is greater than the first groove hole. The turning element is coupled to the substrate and includes a bump exposed from the port and snapped into the snap slot. Each fixing element is passed through each first groove hole and fixed to each hole. The turning element can be turned to push the electronic equipment to move each fixing element into each second groove hole, and separate the electronic equipment from the substrate.

12 Claims, 9 Drawing Sheets

QUICK-RELEASE FIXING STRUCTURE FOR ELECTRONIC EQUIPMENTS

FIELD OF THE INVENTION

The present invention relates to a fixing structure for fixing electronic equipments on a wall or a rod, in particular to a quick-release fixing structure for electronic equipments.

BACKGROUND OF THE INVENTION

Present electronic equipments sometimes have to be installed on a wall or a rod. For example, when an antenna case is installed indoors, the antenna case is usually adjusted to the best position for receiving signals, so that the installation positions of the antenna case may be bizarre; and when the antenna case is installed outdoors, the antenna case is usually installed at a high place for receiving the signals, so that most antenna cases are installed at positions such as a street lamp pole, an attic wall or a railing.

Since the antenna cases are installed at places without a specific regularity regardless of its installation indoors or outdoors, therefore users have to fix the antenna case to a desired place on their own. In general, most antenna cases are fixed by using a string to tie the antenna case onto a rod or using a nail or an adhesive tape to fix the antenna case onto a wall.

However, if the antenna case fails to receive signals and it is necessary to switch the position of the installed antenna case, or inspect, maintain or repair the antenna case, then users have to cut the string in order to remove the antenna case. Even worse, the users require much effort to remove nails or adhesive tapes in order to remove the antenna case, if the antenna case is fixed by nails and adhesive tapes. In addition, the fixing holes may be expanded and the adhesiveness may be insufficient at the original positions of the removed nails or adhesive tapes, so that the antenna case cannot be reinstalled, and the marks of the nails and adhesive tapes ruin the aesthetic look of the environment. Obviously, users are unwilling to use these methods to fix the antenna case.

In view of the aforementioned problems, the inventor of the present invention based on existing technologies to conduct extensive researches and experiments, and finally developed a quick-release fixing structure for electronic equipments in accordance with the present invention to overcome the problems of the prior art.

SUMMARY OF THE INVENTION

Therefore, it is a primary objective of the present invention to provide a quick-release fixing structure for an electronic equipment capable of quickly removing the electronic equipment from a substrate when the electronic equipment is switched to another installation position, inspected, maintained or repaired, so as to improve the convenience of using the electronic equipment.

To achieve the aforementioned objective, the present invention provides a quick-release fixing structure for an electronic equipment, and the electronic equipment has a plurality of holes and a snap slot, and the quick-release fixing structure comprises: a substrate, having a plurality of grooves and a port, each having a first groove hole and a second groove hole interconnected with the first groove hole, and the second groove hole having a size greater than the first groove hole; a turning element, coupled to the substrate, and having a bump connected thereto and exposed from the port and snapped into the corresponding snap slot; and a plurality of fixing elements, passed through the first groove holes respectively and fixed to the hole; thereby the turning element can be turned to push the electronic equipment to move, such that each fixing element is moved into each second groove hole to separate the electronic equipment from the substrate.

The present invention has the following effects. The electronic equipment can be fixed to a rod or a wall selectively by using the support frame or the locking hole of the substrate to provide more disposing positions of the electronic equipment, so that the quick-release fixing structure of the present invention features a very convenient installation. In addition, if it is necessary to change the position of the electronic equipment or inspect, maintain or repair the electronic equipment, the electronic equipment can be removed from the substrate at a fixed position of the rod or the wall, so as to improve the convenience of using the electronic equipment.

DESCRIPTION OF THE PREFERRED EMBODIMENTS

The technical contents of the present invention will become apparent with the detailed description of preferred embodiments accompanied with the illustration of related drawings as follows. It is noteworthy that the drawings are provided for the purpose of illustrating the present invention only, but not intended for limiting the scope of the invention.

Figure 1:
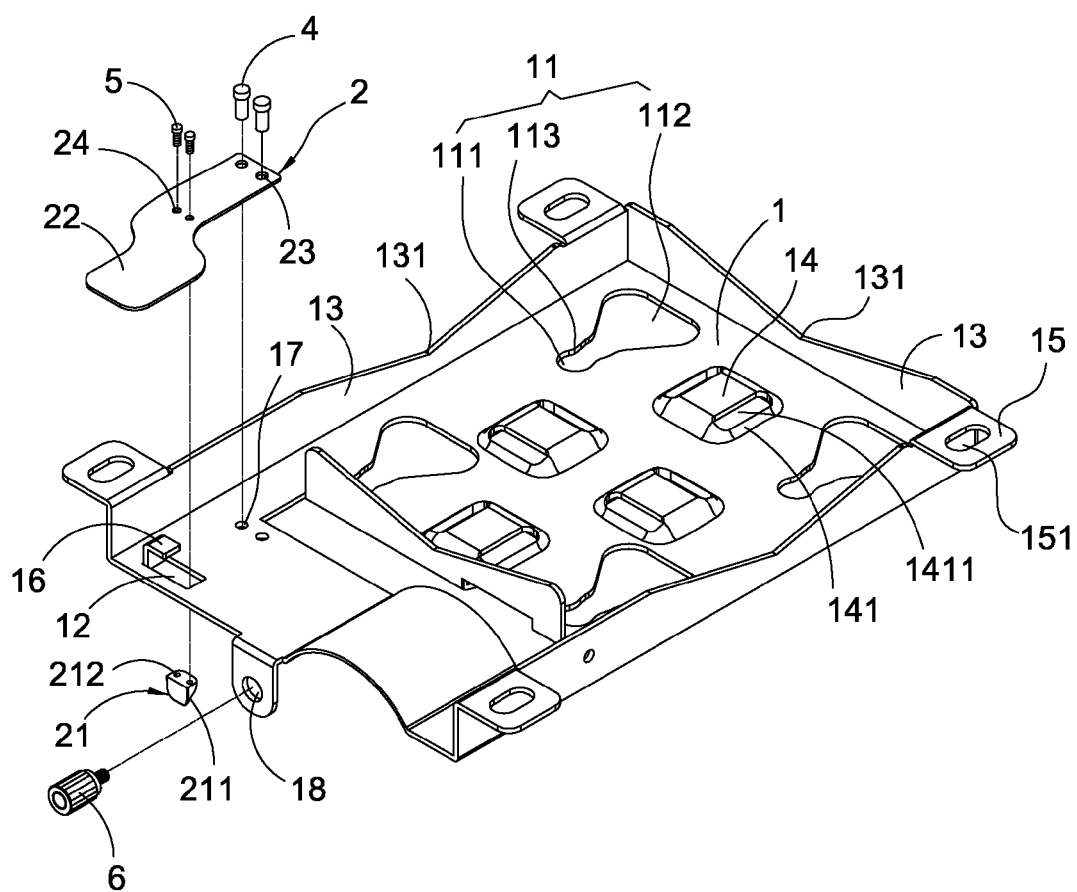
FIG. 1 is an exploded view of a quick-release fixing structure of the present invention.
Figure 2:
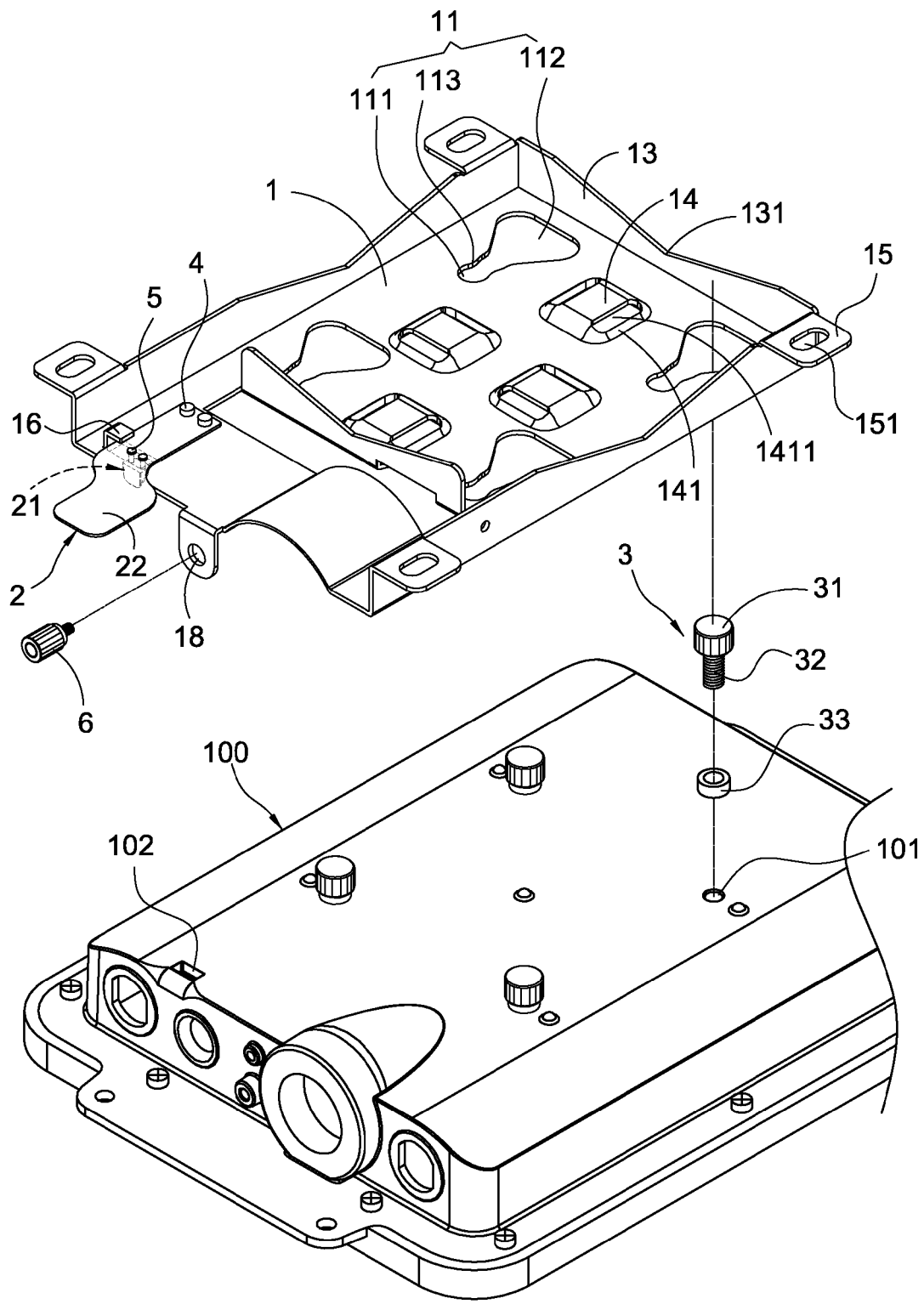
FIG. 2 is another exploded view of a quick-release fixing structure of the present invention.
Figure 3:
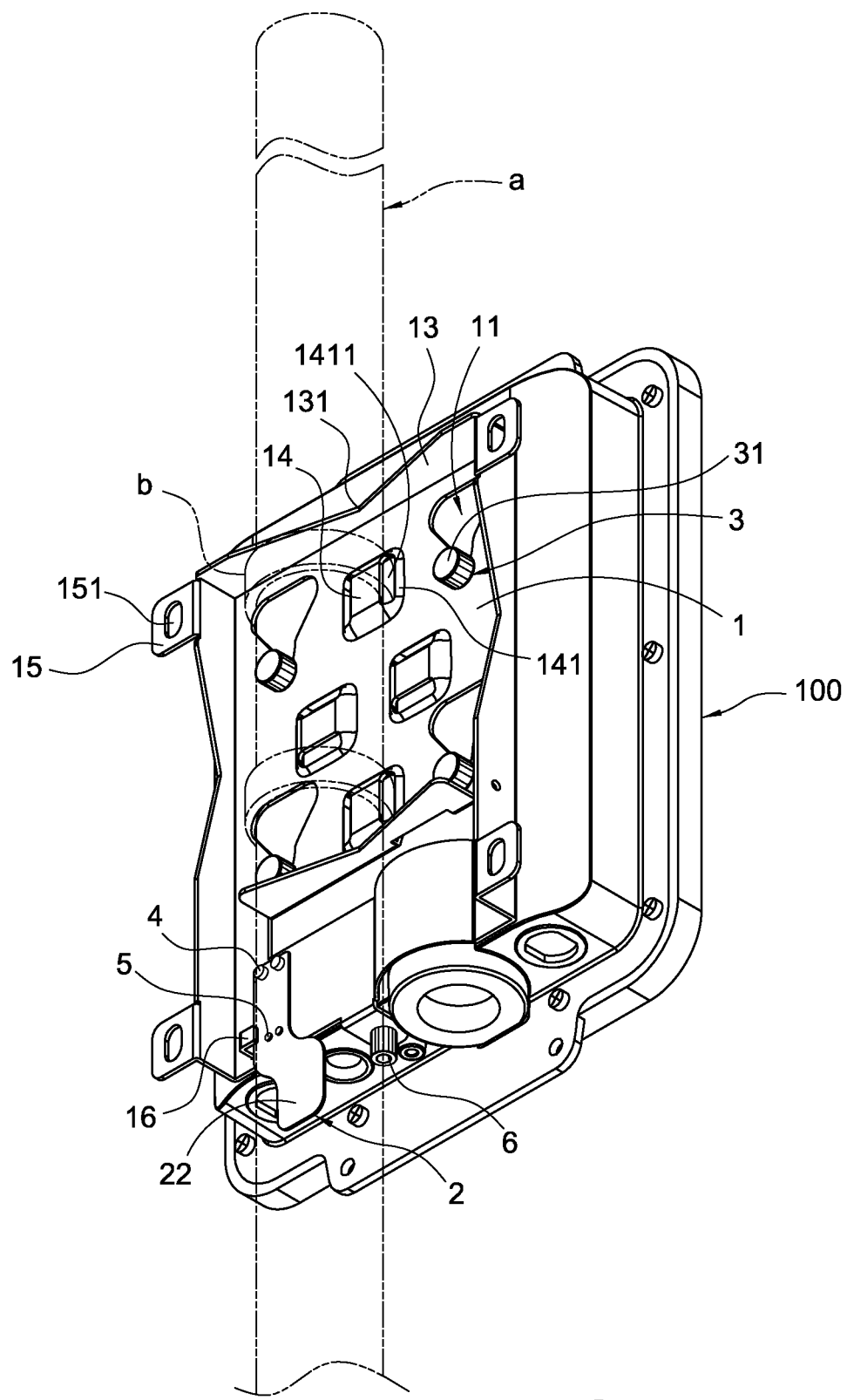
FIG. 3 is a schematic perspective view of a quick-release fixing structure of the present invention.

With reference to FIGS. 1 to 3 for a quick-release fixing structure for an electronic equipment in accordance with the present invention, the electronic equipment 100 has a plurality of holes 101 and a snap slot 102, and the quick-release fixing structure comprises a substrate 1, a turning element 2 and a plurality of fixing elements 3.

The substrate 1 includes a plurality of grooves 11 and a port 12, and each groove 11 includes a first groove hole 111 and a second groove hole 112 interconnected to the first groove hole 111, and the second groove hole 112 has a size greater than the first groove hole 111, and the substrate 1 has a taper portion 113 protruded from a position between the first groove hole 111 and the second groove hole 112. In addition, the substrate 1 includes two parallel support frames 13, and each support frame 13 has a depression 131, and the substrate 1 further has a protrusion 14 protruded from a position between the two support frames 13, and the protrusion 14 has two sidewalls 141 formed at the periphery of the protrusion 14 and perpendicular to the support frame 13, and each of the two sidewalls 141 has a parallel opening 1411. In addition, the substrate 1 has an extension 15 extended from both sides of the substrate 1 separately, and each extension 15 has a locking hole 151, and the substrate 1 has a snap block 16 extended from the substrate and corresponding to the port 12, a via 17, and a penetrating opening 18.

The turning element 2 is coupled to the substrate 1 and latched to a fixed position by the snap block 16. The turning element 2 has a bump 21 exposed from the port 12 and latched to the corresponding snap slot 102. In addition, the turning element 2 has a turning section 22 protruded from the substrate 1, and the bump 21 is substantially a triangular pyramid with corners disposed in a direction away from the turning element 2, and the bump 21 has a bevel 211 formed on a side of the turning section 22, wherein the turning element 2 includes a first penetrating hole 23 and a second penetrating hole 24, and the bump 21 has a through hole 212.

Each fixing element 3 is passed into each respective first groove hole 111 and fixed to the hole 101. More specifically, each fixing element 3 has a head portion 31 with a periphery greater than the size of the first groove hole 111 and smaller than the size of the second groove hole 112, and the fixing element 3 is latched into the first groove hole 111 through the head portion 31. In addition, each fixing element 3 has a rod body 32 and a ring 33 sheathed on the rod body 32, and the periphery of the ring 33 has a size smaller than the size of the first groove hole 111 and slightly greater than the size of the taper portion 113, such that the taper portion 113 can be slightly latched to the ring 33 to lock the rod body 32 to the corresponding hole 101.

The present invention further comprises a first locking element 4, a second locking element 5 and a third locking element 6, wherein the first locking element 4 is passed through the first penetrating hole 23 and locked to the corresponding via 17; the second locking element 5 is passed through the second penetrating hole 24 and locked to the corresponding through hole 212; and the third locking element 6 is passed through the penetrating opening 18 and locked to the electronic equipment 100.

With reference to FIGS. 3 to 7 for an assembly of a quick-release fixing structure of the present invention, the rod body 32 of each fixing element 3 is locked to the corresponding hole 101, and the head portion 31 is latched to the first groove hole 111, and the ring 33 is fastened to the corresponding first groove hole 111, and then the bump 21 is exposed from the port 12 and snapped into the corresponding snap slot 102, so that the electronic equipment 100 is fixed to the substrate 1. In addition, the third locking element 6 is passed through the penetrating opening 18 and locked to the electronic equipment 100 to enhance the stability of combining the electronic equipment 100 with the substrate 1.

Figure 4:
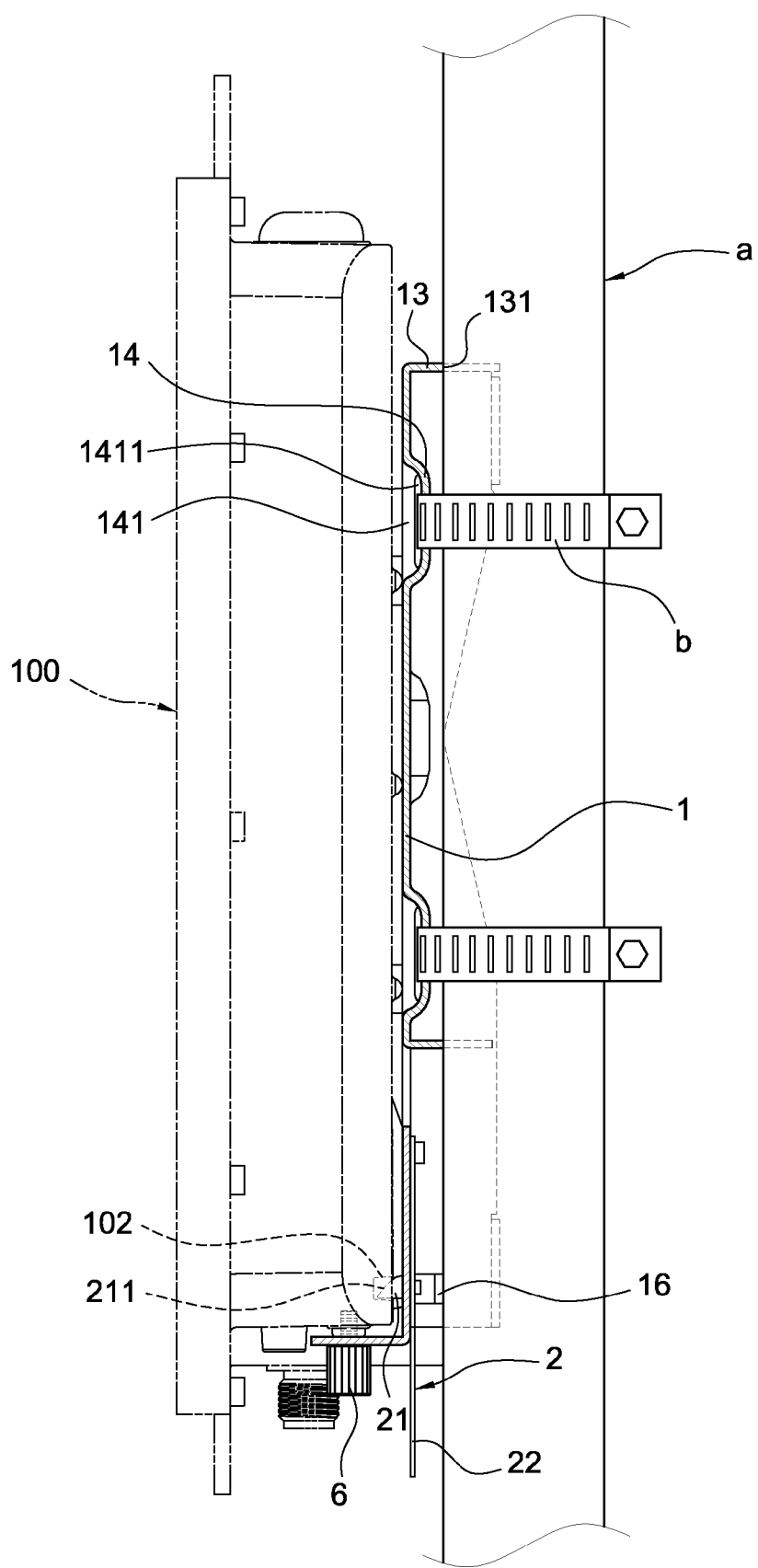
FIG. 4 is a schematic view of a using status of a quick-release fixing structure of the present invention.
Figure 5:
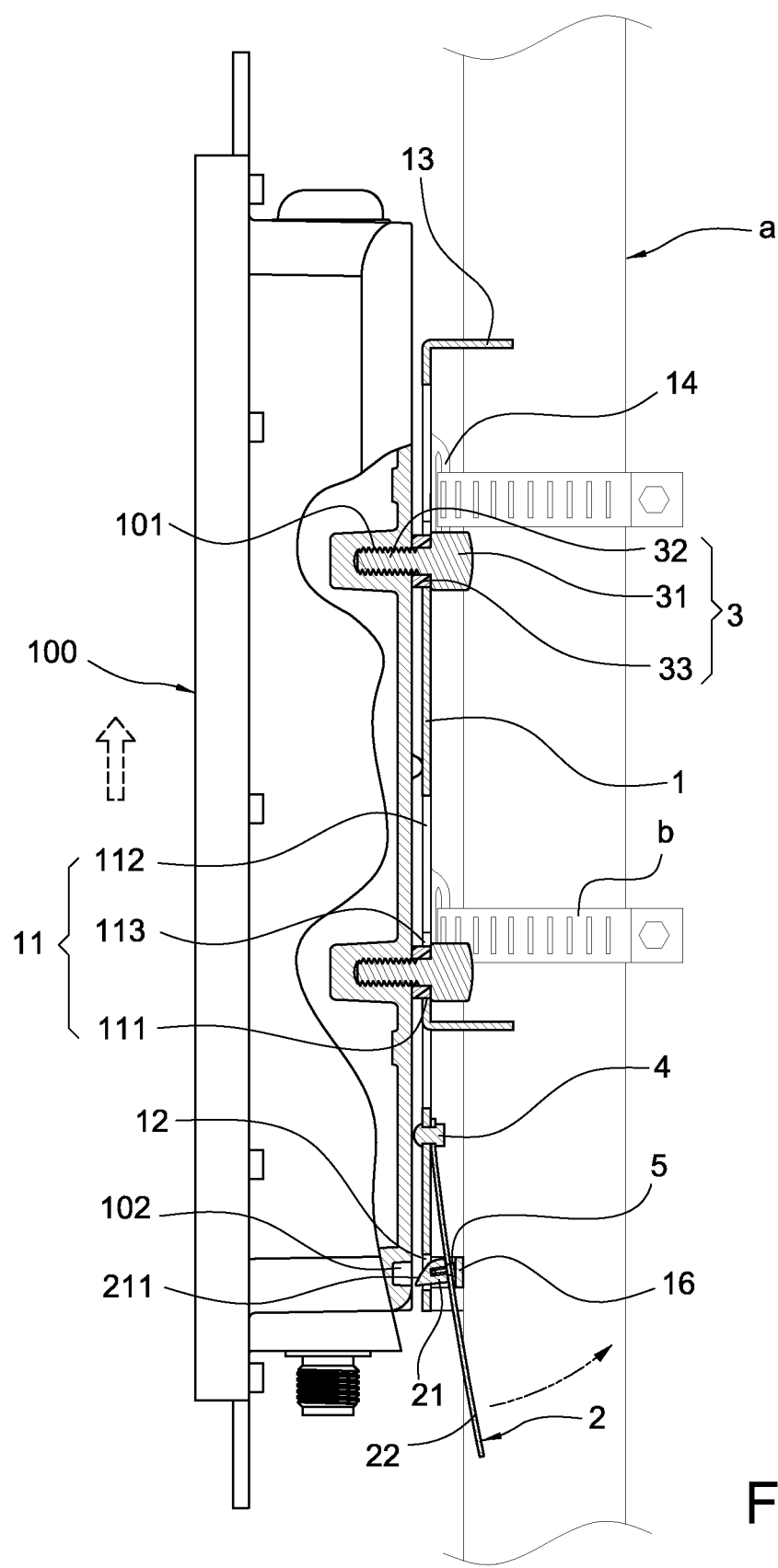
FIG. 5 is a schematic view of another using status of a quick-release fixing structure of the present invention.
Figure 6:
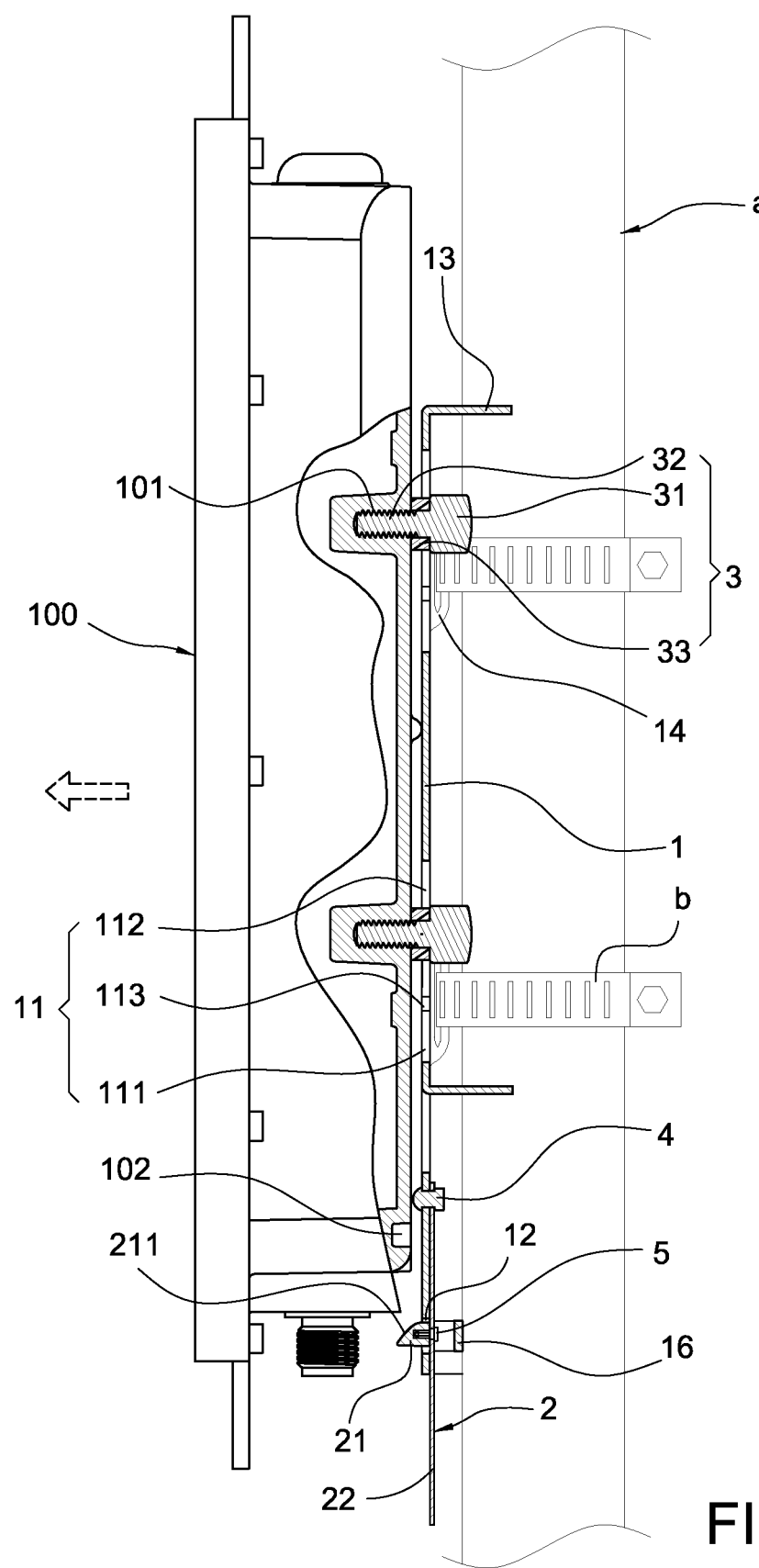
FIG. 6 is a schematic view of a further using status of a quick-release fixing structure of the present invention.
Figure 7:
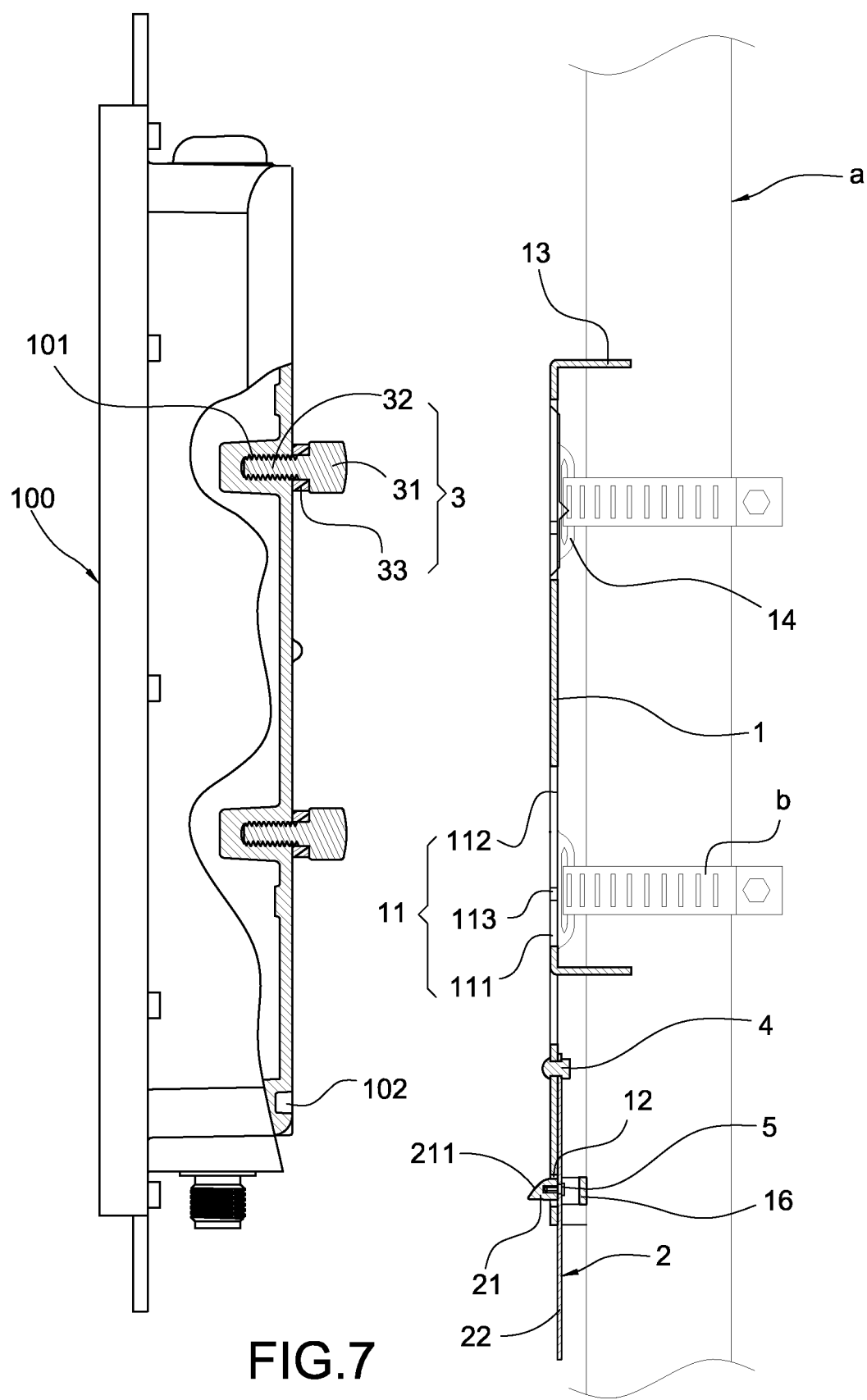
FIG. 7 is a schematic view of another further using status of a quick-release fixing structure of the present invention.

In FIG. 4, the depression 131 of the two support frames 13 is corresponsive to a fixed position of the rod, and a string b is passed through the opening 1411 of the protrusion 14 in order to combine the rod a with the protrusion 14, such that the electronic equipment 100 can be fixed onto the rod a through the substrate 1. In FIGS. 5 to 7, when the third locking element 6 is loosened, the turning element 2 is turned to separate the bump 21 from the snap slot 102 and push and move the electronic equipment 100, so that the ring 33 is passed through the taper portion 11, and each fixing element 3 is moved to each second groove hole 112, so as to separate the electronic equipment 100 from the substrate 1. If it is necessary to change the position of the electronic equipment 100 or inspect, maintain or repair the electronic equipment 100, the substrate 1 is provided for removing the electronic equipment 100 from a fixed position of the rod a quickly to improve the convenience of using the electronic equipment 100.

Figure 8:
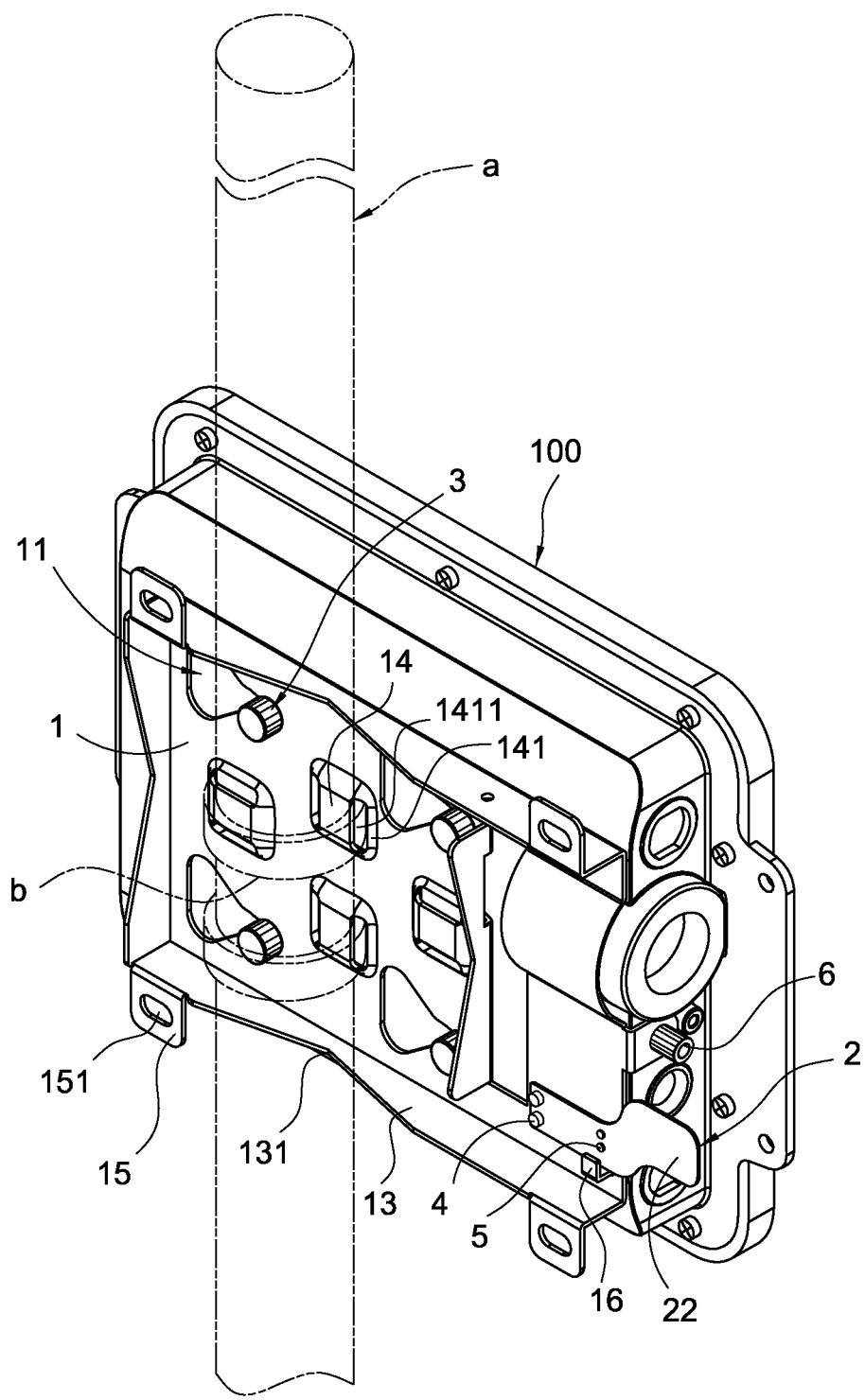
FIG. 8 is a schematic view of a using status of a quick-release fixing structure in accordance with another preferred embodiment of the present invention.

With reference to FIG. 8 for a quick-release fixing structure of another preferred embodiment of the present invention, the substrate 1 includes two support frames 13 extended perpendicularly from the substrate 1, and a protrusion 14 disposed at a corresponding position required for installing each support frame 13, so that the electronic equipment 100 can be installed selectively in a parallel or perpendicular manner by using the two support frames 13 so as to provide more disposing positions of the electronic equipment 100. Thus, the present invention provides a convenient installation.

Figure 9:
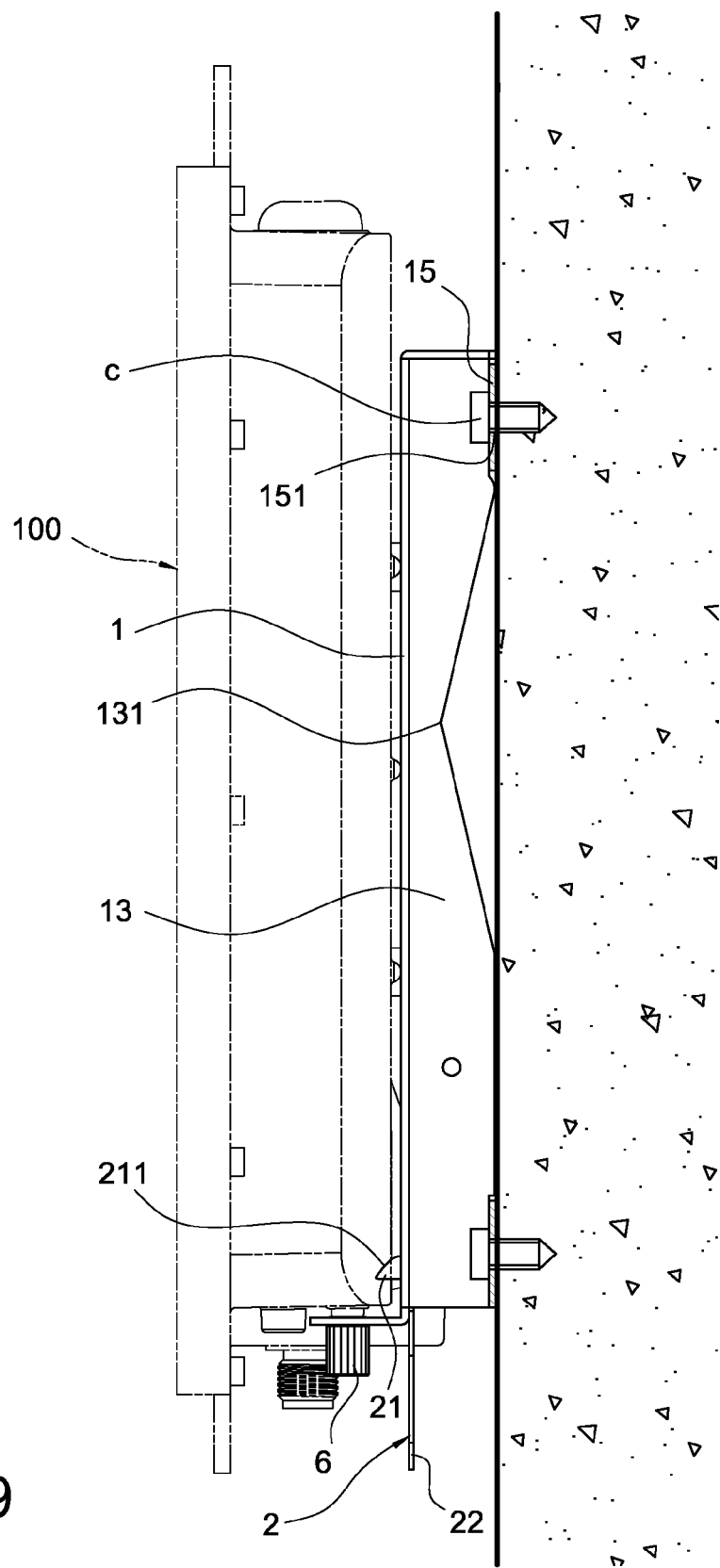
FIG. 9 is a schematic view of a using status of a quick-release fixing structure in accordance with a further preferred embodiment of the present invention.

With reference to FIG. 9 for a quick-release fixing structure in accordance with a further preferred embodiment of the present invention, the substrate 1 has an extension 15 extended from both sides of the substrate 1 separately, and each extension 15 has a locking hole 151, so that a nail c can be passed through the locking hole 151 to fix the substrate 1 and the electronic equipment 100 on a wall to provide more of disposing positions of the electronic equipment 100, so that the present invention provides a convenient installation.

In summation of the description above, the quick-release fixing structure for electronic equipments in accordance with the present invention achieves the expected effects to overcome the drawbacks of the prior art, and complies with the patent application requirements, and thus is duly file for patent application. While the invention has been described by means of specific embodiments, numerous modifications and variations could be made thereto by those skilled in the art without departing from the scope and spirit of the invention set forth in the claims.

What is claimed is:

1. A quick-release fixing structure for an electronic equipment, and the electronic equipment having a plurality of holes and a snap slot, and the quick-release fixing structure comprising:

a substrate, having a plurality of grooves and a port, and each groove including a first groove hole and a second groove hole interconnected to the first groove hole, and the second groove hole having a size greater than the first groove hole;

a flexible element, coupled to the substrate, and having a bump fastened thereto and exposed from the port and snapped into the corresponding snap slot; and a plurality of fixing elements, each penetrating and fixed to the respective hole and further passed through the second groove hole and sliding into the first groove hole to be fixed thereto;

thereby, when the flexible element is pulled away from the substrate so that the bump unbuckles from the snap slot and the electronic equipment is pushed upwardly, each fixing element is moved to each respective second groove hole from each respective first groove hole to separate the electronic equipment from the substrate.

2. The quick-release fixing structure for an electronic equipment as recited in claim 1, wherein each fixing element has a head portion, and the periphery of the head portion has a size greater than the first groove hole and smaller than the second groove hole, and the fixing element is latched to the first groove hole through the head portion.

3. The quick-release fixing structure for an electronic equipment as recited in claim 2, wherein the substrate has a taper portion protruded from a position between the first groove hole and the second groove hole and latched to the fixing element.

4. The quick-release fixing structure for an electronic equipment as recited in claim 3, wherein each fixing element includes a rod body and a ring sheathed on the rod, and the periphery of the ring has a size smaller than the first groove hole; the taper portion can be slightly latched to the ring and the rod body is locked to the corresponding hole.

5. The quick-release fixing structure for an electronic equipment as recited in claim 3, wherein the substrate has two parallel support frames extended from the substrate, and each support frame has a depression.

6. The quick-release fixing structure for an electronic equipment as recited in claim 5, wherein the substrate has a protrusion protruded from a position between the two support frames, and two sidewalls formed on the periphery of the protrusion and perpendicular to the support frames, and parallel holes are formed on the two sidewalls respectively.

7. The quick-release fixing structure for an electronic equipment as recited in claim 3, wherein the substrate has an extension extended from two edges of the substrate respectively, and each extension has a locking hole.

8. The quick-release fixing structure for an electronic equipment as recited in claim 3, wherein the substrate includes a snap block extended from the substrate and disposed at a position corresponding to the port, and the snap block latches and fixes the flexible element.

9. The quick-release fixing structure for an electronic equipment as recited in claim 3, wherein the flexible element is protruded from the substrate to define a flexible section, and the bump is substantially a triangular pyramid, and the bump has a bevel formed on a side away from the flexible section.

10. The quick-release fixing structure for an electronic equipment as recited in claim 3, further comprising a first locking element, and the flexible element having a first penetrating hole, and the substrate having a via, and the first locking element being passed through the first penetrating hole and locked to the corresponding via.

11. The quick-release fixing structure for an electronic equipment as recited in claim 3, further comprising a second locking element, and the flexible element having a second penetrating hole, and the bump having a through hole, and the second locking element being passed through the second penetrating hole and locked to the corresponding through hole.

12. The quick-release fixing structure for an electronic equipment as recited in claim 3, further comprising a third locking element, and the substrate having a penetrating opening, and the third locking element being passed through the penetrating opening and locked to the electronic equipment.

* * * * *